(12) United States Patent
Pang et al.

(10) Patent No.: US 11,219,900 B2
(45) Date of Patent: Jan. 11, 2022

(54) DIGITAL MICROFLUIDIC DEVICE, MICROFLUIDIC APPARATUS, LAB-ON-A-CHIP DEVICE, DIGITAL MICROFLUIDIC METHOD, AND METHOD OF FABRICATING DIGITAL MICROFLUIDIC DEVICE

(71) Applicants: BEIJING BOE OPTOELECTRONICS TECHNOLOGY CO., LTD., Beijing (CN); BOE Technology Group Co., Ltd., Beijing (CN)

(72) Inventors: Fengchun Pang, Beijing (CN); Peizhi Cai, Beijing (CN); Yue Geng, Beijing (CN); Le Gu, Beijing (CN); Chuncheng Che, Beijing (CN); Hailin Xue, Beijing (CN); Xibin Shao, Beijing (CN)

(73) Assignees: BEIJING BOE OPTOELECTRONICS TECHNOLOGY CO., LTD., Beijing (CN); BOE Technology Group Co., Ltd., Beijing (CN)

( * ) Notice: Subject to any disclaimer, the term of this patent is extended or adjusted under 35 U.S.C. 154(b) by 470 days.

(21) Appl. No.: 16/334,126

(22) PCT Filed: Sep. 12, 2018

(86) PCT No.: PCT/CN2018/105221
§ 371 (c)(1),
(2) Date: Mar. 18, 2019

(87) PCT Pub. No.: WO2019/134388
PCT Pub. Date: Jul. 11, 2019

(65) Prior Publication Data
US 2021/0322987 A1 Oct. 21, 2021

(30) Foreign Application Priority Data

Jan. 4, 2018 (CN) .......................... 201810008675.9

(51) Int. Cl.
*B01L 3/00* (2006.01)
*H01L 27/12* (2006.01)
*H01L 27/144* (2006.01)

(52) U.S. Cl.
CPC ... *B01L 3/502792* (2013.01); *B01L 3/502707* (2013.01); *H01L 27/1214* (2013.01);
(Continued)

(58) Field of Classification Search
CPC ........ B01L 3/502792; B01L 3/502707; B01L 2300/0654; B01L 2300/16;
(Continued)

(56) References Cited

U.S. PATENT DOCUMENTS

2011/0220505 A1   9/2011   Wang et al.
2019/0105655 A1   4/2019   Dong et al.

FOREIGN PATENT DOCUMENTS

CN    101773814 A    7/2010
CN    101859048 A    10/2010
(Continued)

OTHER PUBLICATIONS

International Search Report & Written Opinion dated Nov. 30, 2018, regarding PCT/CN2018/105221.
(Continued)

*Primary Examiner* — Jennifer Wecker
(74) *Attorney, Agent, or Firm* — Intellectual Valley Law, P.C.

(57) ABSTRACT

A digital microfluidic device includes a thin film transistor driving substrate. The thin film transistor driving substrate includes a first base substrate; a plurality of sample actuating
(Continued)

units; a plurality of sample position detecting units; a dielectric insulating layer on a side of the plurality of sample actuating units and the plurality of sample position detecting units distal to the first base substrate; and a first hydrophobic layer on a side of the dielectric insulating layer distal to the first base substrate. Each of the plurality of sample actuating units includes a first electrode configured to drive transportation of a liquid droplet on the digital microfluidic device. Each of the plurality of sample position detecting units includes a photosensor configured to detect presence or absence of the liquid droplet on a position corresponding to the photosensor.

20 Claims, 7 Drawing Sheets

(52) U.S. Cl.
CPC ...... *H01L 27/1259* (2013.01); *H01L 27/1446* (2013.01); *B01L 2200/10* (2013.01); *B01L 2200/12* (2013.01); *B01L 2200/143* (2013.01); *B01L 2300/0645* (2013.01); *B01L 2300/0654* (2013.01); *B01L 2300/0819* (2013.01); *B01L 2300/12* (2013.01); *B01L 2300/16* (2013.01); *B01L 2300/165* (2013.01)

(58) Field of Classification Search
CPC .......... B01L 2200/143; B01L 2200/10; B01L 2300/0645; B01L 2300/12; B01L 2300/165; B01L 2200/12; B01L 2300/0819; H01L 27/1446; H01L 27/1214; H01L 27/1259
See application file for complete search history.

(56) References Cited

FOREIGN PATENT DOCUMENTS

| | | |
|---|---|---|
| CN | 102671724 A | 9/2012 |
| CN | 107255710 A | 10/2017 |
| CN | 107497509 A | 12/2017 |
| JP | 2014171966 A | 9/2014 |

OTHER PUBLICATIONS

First Office Action in the Indian Patent Application No. 202027018350, dated Apr. 27, 2021.

DIGITAL MICROFLUIDIC DEVICE, MICROFLUIDIC APPARATUS, LAB-ON-A-CHIP DEVICE, DIGITAL MICROFLUIDIC METHOD, AND METHOD OF FABRICATING DIGITAL MICROFLUIDIC DEVICE

CROSS-REFERENCE TO RELATED APPLICATION

This application is a national stage application under 35 U.S.C. § 371 of International Application No. PCT/CN2018/105221, filed Sep. 12, 2018, which claims priority to Chinese Patent Application No. 201810008675.9, filed Jan. 4, 2018, the contents of which are incorporated by reference in the entirety.

TECHNICAL FIELD

The present invention relates to microfluidic technology, more particularly, to a digital microfluidic device, a microfluidic apparatus, a lab-on-a-chip device, a digital microfluidic method, and a method of fabricating a digital microfluidic device.

BACKGROUND

Microfluidics enables precise control and manipulation of fluids that are geometrically constrained to small volumes (e.g., microliter-scale). Microfluidics can transform routine bioassays into rapid and reliable tests due to its rapid kinetics and the potential for automation. Digital microfluidics has been developed for miniaturized bioassays. The technique enables manipulation of discrete droplets of fluids across a surface of patterned electrodes. Using digital microfluidics, array-based bioassays can be easily performed to conduct various biochemical reactions by merging and mixing those droplets. Moreover, large, parallel scaled, multiplexed analyses can be performed using digital microfluidics. Digital microfluidics has found a wide variety of applications including cell-based assays, enzyme assays, protein profiling, and the polymerase chain reaction.

SUMMARY

In one aspect, the present disclosure provides a digital microfluidic device comprising a thin film transistor driving substrate; wherein the thin film transistor driving substrate comprises a first base substrate; a plurality of sample actuating units; a plurality of sample position detecting units; a dielectric insulating layer on a side of the plurality of sample actuating units and the plurality of sample position detecting units distal to the first base substrate; and a first hydrophobic layer on a side of the dielectric insulating layer distal to the first base substrate; wherein each of the plurality of sample actuating units comprises a first thin film transistor on the first base substrate, and comprising a first gate electrode, a first source electrode, and a first drain electrode; and a first electrode electrically connected to the first drain electrode and configured to drive transportation of a liquid droplet on the digital microfluidic device; wherein each of the plurality of sample position detecting units comprises a second thin film transistor on the first base substrate, and comprising a second gate electrode, a second source electrode, and a second drain electrode; and a photosensor electrically connected to the second source electrode, and configured to detect presence or absence of the liquid droplet on a position corresponding to the photosensor.

Optionally, the digital microfluidic device further comprises a gate line electrically connected to the first gate electrode and the second gate electrode, and configured to provide a gate scanning signal to turn on the first thin film transistor and the second thin film transistor; a first electrode driving signal line electrically connected to the first source electrode, and configured to provide a driving signal to the first electrode when the first thin film transistor is turned on; and a read line electrically connected to the second drain electrode, and configured to transmitting signals detected by the photosensor.

Optionally, the digital microfluidic device further comprises a common electrode electrically connected to the photosensor, and a common electrode signal line configured to be provided with a common voltage signal to the common electrode; wherein the photosensor comprises a first polarity region electrically connected to the common electrode; a second polarity region electrically connected to the second source electrode; and a diode junction electrically connecting the first polarity region and the second polarity region.

Optionally, the digital microfluidic device further comprises a contact electrode electrically connecting the second polarity region to the second source electrode; wherein the contact electrode and the second source electrode are in a same layer and comprise a same material.

Optionally, the digital microfluidic device further comprises a first insulating layer on a side of the second source electrode distal to the first base substrate; wherein a lateral side of the photosensor adjacent to the second source electrode is spaced apart from the second source electrode by the first insulating layer.

Optionally, the first insulating layer is on a side of the first source electrode, the first drain electrode, the second source electrode, and the second drain electrode distal to the first base substrate; the thin film transistor driving substrate comprises a first via extending through the first insulating layer; and the photosensor is electrically connected to the second source electrode through the first via.

Optionally, the digital microfluidic device further comprises a common electrode electrically connected to the photosensor, and on a side of the photosensor distal to the first base substrate; a second insulating layer on a side of the common electrode and the photosensor distal to the first base substrate, a common electrode signal line configured to be provided with a common voltage signal to the common electrode, and on a side of the second insulating layer distal to the first base substrate; wherein the thin film transistor driving substrate comprises a second via extending through the second insulating layer; and the common electrode signal line is electrically connected to the common electrode through the second via.

Optionally, the digital microfluidic device further comprises a third insulating layer on a side of the common electrode signal line distal to the first base substrate; wherein the first electrode is on a side of the third insulating layer distal to the first base substrate, and on a side of the dielectric insulating layer facing the first base substrate; the thin film transistor driving substrate comprises a third via extending through the third insulating layer and the second insulating layer; and the first electrode is electrically connected to the first drain electrode through the third via.

Optionally, the digital microfluidic device further comprises a counter substrate spaced apart from the thin film transistor driving substrate; wherein the counter substrate comprises a second base substrate; a second electrode on a side of the second base substrate facing the thin film transistor driving substrate; and a second hydrophobic layer on a side of the second electrode facing the thin film transistor driving substrate.

Optionally, an orthographic projection of the first electrode on the first base substrate covers an orthographic projection of the photosensor on the first base substrate; and the first electrode is a substantially transparent electrode.

Optionally, the digital microfluidic device comprises an array of a plurality of sample actuating and position detecting units; wherein each of the plurality of sample actuating and position detecting units comprising one of the plurality of sample actuating units and one of the plurality of sample position detecting units; and the first thin film transistor of the one of the plurality of sample actuating units and the thin film second transistor of the one of the plurality of sample position detecting units are electrically connected to a same gate line, and are configured to be turned on simultaneously.

Optionally, the digital microfluidic device further comprises a plurality of gate lines, a plurality of first electrode driving signal lines, and a plurality of read lines; wherein the plurality of gate lines intersect with the plurality of first electrode driving signal lines and the plurality of read lines, thereby forming a plurality of sample actuating and position detecting regions; and the plurality of sample actuating and position detecting units are respectively in the plurality of sample actuating and position detecting regions.

In another aspect, the present disclosure provides a microfluidic apparatus comprising the digital microfluidic device described herein or fabricated by a method described herein; a photo-sensing circuit configured to receive signals detected by the photosensor, and an electrode driving circuit configured to provide a driving signal to the first electrode.

In another aspect, the present disclosure provides a lab-on-a-chip device comprising the digital microfluidic device described herein or fabricated by a method described herein.

In another aspect, the present disclosure provides a digital microfluidic method, comprising selectively transporting a liquid droplet using a digital microfluidic device; wherein the digital microfluidic device comprises a thin film transistor driving substrate; wherein the thin film transistor driving substrate comprises a first base substrate; a plurality of sample actuating units; a plurality of sample position detecting units; a dielectric insulating layer on a side of the plurality of sample actuating units and the plurality of sample position detecting units distal to the first base substrate; and a first hydrophobic layer on a side of the dielectric insulating layer distal to the first base substrate; wherein each of the plurality of sample actuating units comprises a first base substrate; a first thin film transistor on the first base substrate, and comprising a first gate electrode, a first source electrode, and a first drain electrode; a first electrode electrically connected to the first drain electrode and configured to drive transportation of a liquid droplet on the digital microfluidic device; wherein each of the plurality of sample position detecting units comprises a second thin film transistor on the first base substrate, and comprising a second gate electrode, a second source electrode, and a second drain electrode; a photosensor electrically connected to the second source electrode, and configured to detect presence or absence of the liquid droplet on a position corresponding to the photosensor; wherein the method comprises detecting a position of the liquid droplet relative to the plurality of sample position detecting units using the photosensor in each individual one of the plurality of sample position detecting units; and driving transportation of the liquid droplet on the digital microfluidic device based on the position of the liquid droplet relative to the plurality of sample position detecting units.

Optionally, driving transportation of the liquid droplet comprises determining a present sample actuating and position detecting region in which the liquid droplet is at least partially located and a present sample actuating unit of the plurality of sample actuating units is located; and actuating the first electrode in a next directly adjacent sample actuating unit of the plurality of sample actuating units in a next directly adjacent sample actuating and position detecting region, thereby transporting the liquid droplet along a direction from the present sample actuating unit to the next directly adjacent sample actuating unit.

Optionally, actuating the first electrode in the next directly adjacent sample actuating unit comprises providing a driving signal to the first source electrode of the first thin film transistor in the next directly adjacent sample actuating unit; and providing a gate scanning signal to turn on the first thin film transistor in the next directly adjacent sample actuating unit, thereby allowing the driving signal to be provided to the first electrode in the next directly adjacent sample actuating unit.

Optionally, detecting the position of the liquid droplet relative to the plurality of sample position detecting units comprises providing a gate scanning signal to turn on the second thin film transistor; transmitting a photo-sensing signal detected by the photosensor; and comparing the photo-sensing signal with a reference signal, thereby determining presence or absence of the liquid droplet at the position corresponding to the photosensor.

Optionally, the digital microfluidic device comprises an array of a plurality of sample actuating and position detecting units arranged in rows and columns; a plurality of gate lines; a plurality of first electrode driving signal lines; and a plurality of read lines; wherein each of the plurality of sample actuating and position detecting units comprising one of the plurality of sample actuating units and one of the plurality of sample position detecting units; the plurality of gate lines intersect with the plurality of first electrode driving signal lines and the plurality of read lines, thereby forming a plurality of sample actuating and position detecting regions; and the plurality of sample actuating and position detecting units are respectively in the plurality of sample actuating and position detecting regions; wherein the method comprising providing a plurality of gate scanning signals respectively through the plurality of gate lines to a plurality rows of the plurality of sample actuating and position detecting units respectively; and first thin film transistors and second thin film transistors respectively in the plurality of sample actuating and position detecting units are turned on row by row.

In another aspect, the present disclosure provides a method of fabricating a digital microfluidic device, comprising forming a thin film transistor driving substrate; wherein forming the thin film transistor driving substrate comprises forming a plurality of sample actuating units and a plurality of sample position detecting units on a first base substrate; forming a dielectric insulating layer on a side of the plurality of sample actuating units and the plurality of sample position detecting units distal to the first base substrate; and forming a first hydrophobic layer on a side of the dielectric insulating layer distal to the first base substrate; wherein forming each of the plurality of sample actuating units comprises forming a first thin film transistor on the first base substrate, the first thin film transistor formed to comprise a first gate electrode, a first source electrode, and a first drain electrode; and forming a first electrode electrically connected to the first drain electrode and configured to drive transportation of a liquid droplet on the digital microfluidic device; wherein forming each of the plurality of sample position detecting units comprises forming a second thin film transistor on the first base substrate, the second thin film transistor formed to comprise a second gate electrode, a second source electrode, and a second drain electrode; and forming a photosensor electrically connected to the second source electrode, and configured to detect presence or absence of the liquid droplet on a position corresponding to the photosensor.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a digital microfluidic device, a microfluidic apparatus, a lab-on-a-chip device, a digital microfluidic method, and a method of fabricating a digital microfluidic device that substantially obviate one or more of the problems due to limitations and disadvantages of the related art. In one aspect, the present disclosure provides a digital microfluidic device. In some embodiments, the digital microfluidic device includes thin film transistor driving substrate. In some embodiments, the thin film transistor driving substrate includes a first base substrate; a plurality of sample actuating units; a plurality of sample position detecting units; a dielectric insulating layer on a side of the plurality of sample actuating units and the plurality of sample position detecting units distal to the first base substrate; and a first hydrophobic layer on a side of the dielectric insulating layer distal to the first base substrate. Optionally, each of the plurality of sample actuating units includes a first thin film transistor on the first base substrate, and a first electrode electrically connected to the first thin film transistor. The first thin film transistor includes a first gate electrode, a first source electrode, and a first drain electrode. The first electrode is electrically connected to the first drain electrode and is configured to drive transportation of a liquid droplet on the digital microfluidic device. Optionally, each of the plurality of sample position detecting units includes a second thin film transistor on the first base substrate, and a photosensor electrically connected to the second thin film transistor. The second thin film transistor includes a second gate electrode, a second source electrode, and a second drain electrode. The photosensor is electrically connected to the second source electrode, and is configured to detect presence or absence of the liquid droplet on a position corresponding to the photosensor.

Figure 1:
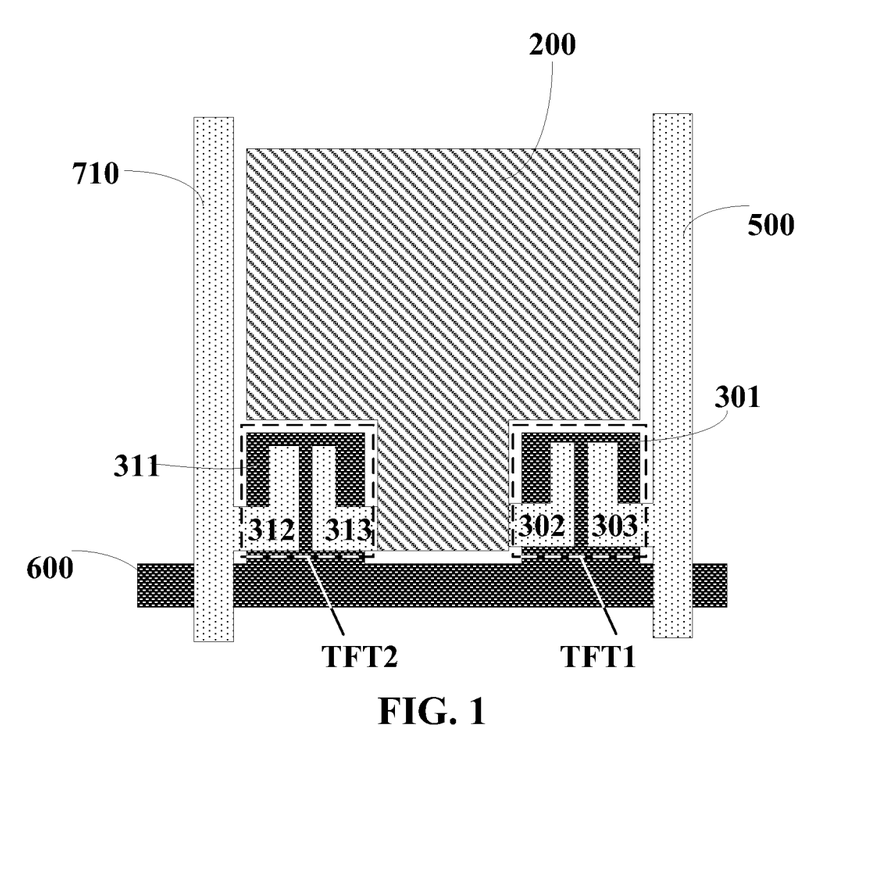
FIG. 1 is a schematic diagram illustrating a partial structure of a digital microfluidic device in some embodiments according to the present disclosure.
Figure 2:
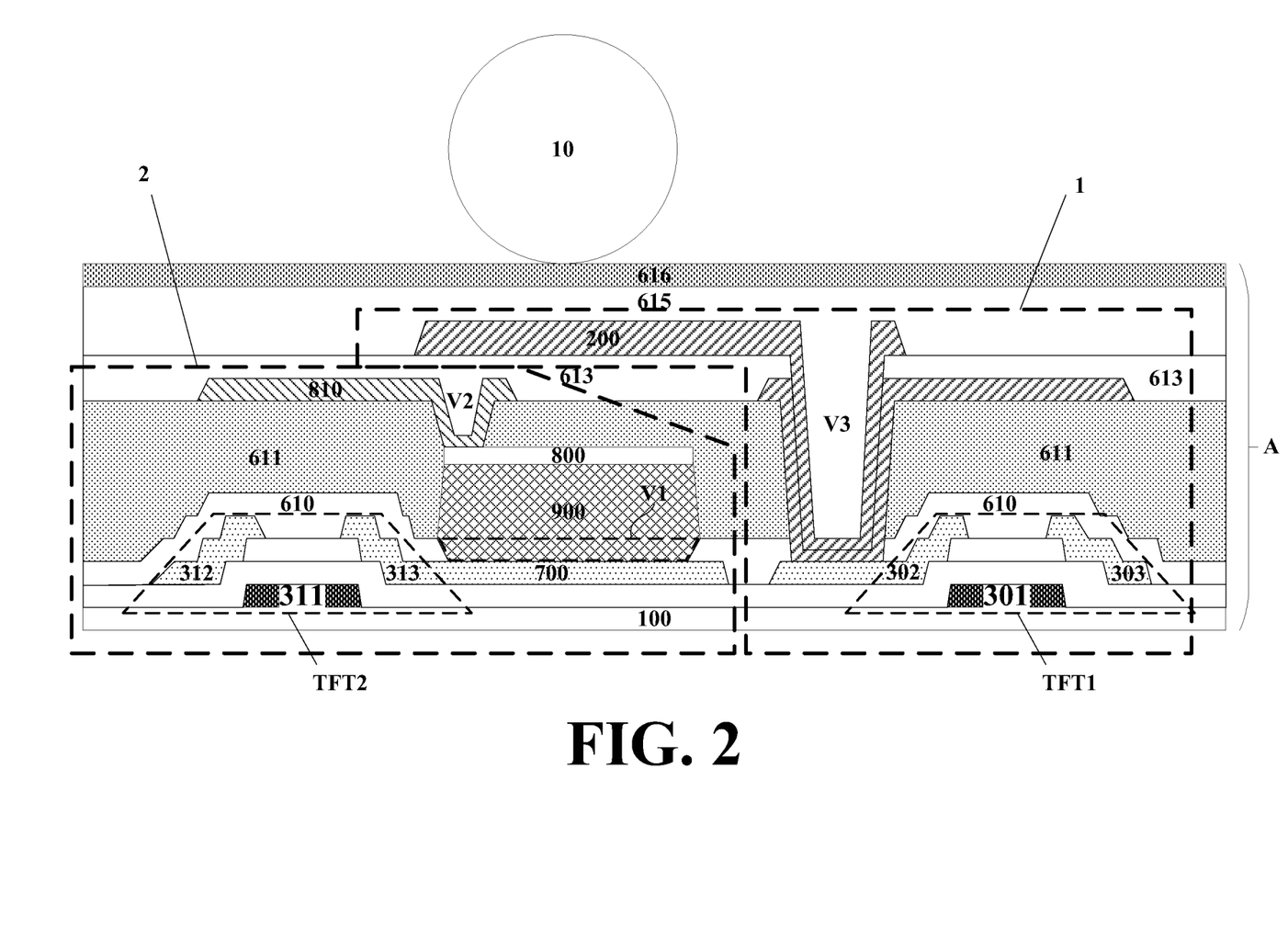
FIG. 2 is a schematic diagram illustrating a partial structure of a digital microfluidic device in some embodiments according to the present disclosure.

FIG. 1 is a schematic diagram (in plan view) illustrating a partial structure of a digital microfluidic device in some embodiments according to the present disclosure. FIG. 2 is a schematic diagram (in cross-sectional view) illustrating a partial structure of a digital microfluidic device in some embodiments according to the present disclosure. Referring to FIG. 1 and FIG. 2, the digital microfluidic device includes thin film transistor driving substrate A. The thin film transistor driving substrate A includes a first base substrate 100; a plurality of sample actuating units 1; a plurality of sample position detecting units 2; a dielectric insulating layer 615 on a side of the plurality of sample actuating units 1 and the plurality of sample position detecting units 2 distal to the first base substrate 100; and a first hydrophobic layer 616 on a side of the dielectric insulating layer 615 distal to the first base substrate 100. The outer surface of the first hydrophobic layer 616 is configured to be in contact with a liquid droplet 10 on it pathway. When an actuating voltage is applied to the first electrode 200 adjacent to the liquid droplet 10, the de-wetting behavior between the liquid droplet 10 and a surface of the first hydrophobic layer 616 above the first electrode 200 adjacent to the liquid droplet 10 undergoes a change, e.g., becoming less hydrophobic. As the actuating voltage increases, the contact angle of the liquid droplet 10 on the surface of the first hydrophobic layer 616 above the first electrode 200 decreases. As a result of the change in the de-wetting behavior and the decrease in the contact angle, the liquid droplet 10 is driven to move toward the first electrode 200 applied with the actuating voltage adjacent to the liquid droplet 10. By sequentially applying the actuating voltages respectively to a plurality of first electrode, the liquid droplet 10 can be transported along the direction the actuating voltage is applied.

Referring to FIG. 2, each of the plurality of sample actuating units 1 includes a first thin film transistor TFT1 on the first base substrate 100, and a first electrode 200 electrically connected to the first thin film transistor TFT1. The first thin film transistor TFT1 includes a first gate electrode 301, a first source electrode 303, and a first drain electrode 302. The first electrode 200 is electrically connected to the first drain electrode 302 and is configured to drive transportation of the liquid droplet 10 on the digital microfluidic device.

Referring to FIG. 2, each of the plurality of sample position detecting units 2 includes a second thin film transistor TFT2 on the first base substrate 100, and a photosensor 900 electrically connected to the second thin film transistor TFT2. The second thin film transistor TFT2 includes a second gate electrode 311, a second source electrode 313, and a second drain electrode 312. The photosensor 900 is electrically connected to the second source electrode 313, and is configured to detect presence or absence of the liquid droplet 10 on a position corresponding to the photosensor 900.

Various appropriate arrangements of the plurality of sample actuating units 1 and the plurality of sample position detecting units 2 may be implemented. Optionally, a ratio of a total number of the plurality of sample actuating units 1 to a total number of the plurality of sample position detecting units 2 is in a range of 1:50 to 50:1, e.g., 1:25 to 25:1, 1:10 to 10:1, 1:5 to 5:1, 1:2.5 to 2.5:1, 1:2 to 2:1, 1:1.5 to 1.5:1. Optionally, the ratio of the total number of the plurality of sample actuating units 1 to the total number of the plurality of sample position detecting units 2 is 1:1. Optionally, the plurality of sample actuating units 1 may be arranged in an array, and the plurality of sample position detecting units 2 may be arranged in an array. Optionally, the plurality of sample actuating units 1 and the plurality of sample position detecting units 2 may be formed to have a pattern corresponding to a designed path for a liquid droplet in a microfluidic apparatus.

Referring to FIG. 1, the digital microfluidic device in some embodiments includes a gate line 600 electrically connected to the first gate electrode 301 and the second gate electrode 311, and configured to provide a gate scanning signal to turn on the first thin film transistor TFT1 and the second thin film transistor TFT2. In FIG. 1, the first gate electrode 301 and the second gate electrode 311 are commonly connected to a same gate line 600. Optionally, the first gate electrode 301 and the second gate electrode 311 are controlled respectively by two separate gate lines for respectively providing two different gate scanning signals respectively to the first gate electrode 301 and the second gate electrode 311.

Referring to FIG. 1, the digital microfluidic device in some embodiments includes a first electrode driving signal line 500 electrically connected to the first source electrode 303. The first electrode driving signal line 500 is configured to provide a driving signal to the first source electrode 303. When the first thin film transistor TFT1 is turned on, the first thin film transistor TFT1 allows the driving signal to pass from the first source electrode 303 to the first drain electrode 302, which in turn is electrically connected to the first electrode 200, as shown in FIG. 1 and FIG. 2. The first electrode 200 provided with the driving signal is configured to drive transportation of the liquid droplet 10 on the digital microfluidic device, as described in more details below in connection with the digital microfluidic method section.

Referring to FIG. 1, the digital microfluidic device in some embodiments includes a read line 710 electrically connected to the second drain electrode 312, and configured to transmitting signals detected by the photosensor 900, for example, to a photo-sensing circuit.

Figure 3:
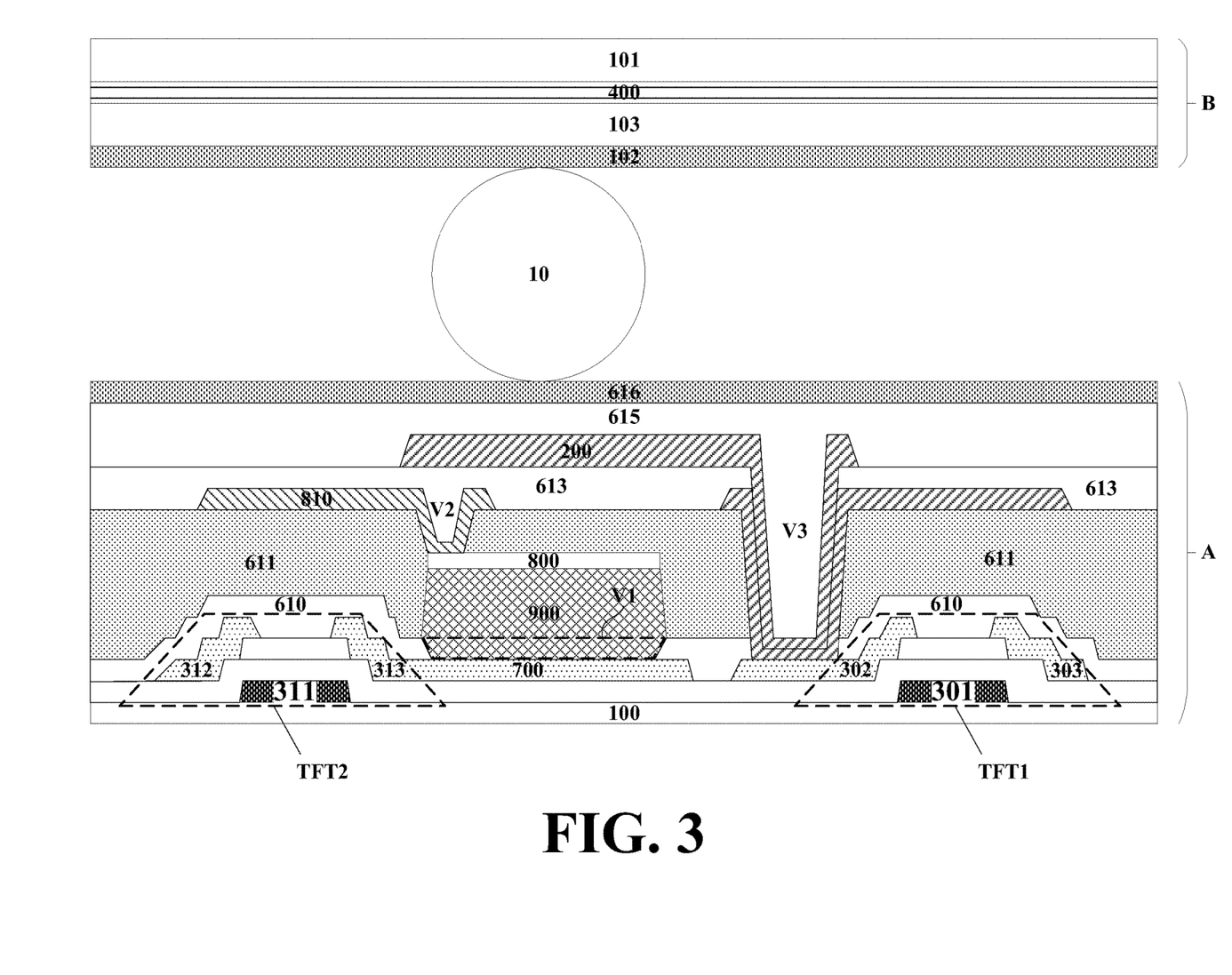
FIG. 3 is a schematic diagram illustrating a partial structure of a digital microfluidic device in some embodiments according to the present disclosure.

FIG. 3 is a schematic diagram illustrating a partial structure of a digital microfluidic device in some embodiments according to the present disclosure. Referring to FIG. 3, the digital microfluidic device in some embodiments further includes a counter substrate B. The counter substrate B is spaced apart from the thin film transistor driving substrate A. In some embodiments, the counter substrate B includes a second base substrate 101, a second electrode 400 on a side of the second base substrate 101 facing the thin film transistor driving substrate A, and a second hydrophobic layer 102 on a side of the second electrode 400 facing the thin film transistor driving substrate A. Optionally, the digital microfluidic device is configured to drive the transportation of the liquid droplet 10 sandwiched between the first hydrophobic layer 616 and the second hydrophobic layer 102. Optionally, the second electrode 400 is configured to be provided with a common voltage, e.g., a ground voltage, while the first electrode 200 with a driving voltage (e.g., an actuating voltage) to transport the liquid droplet 10 along a path.

Figure 4:
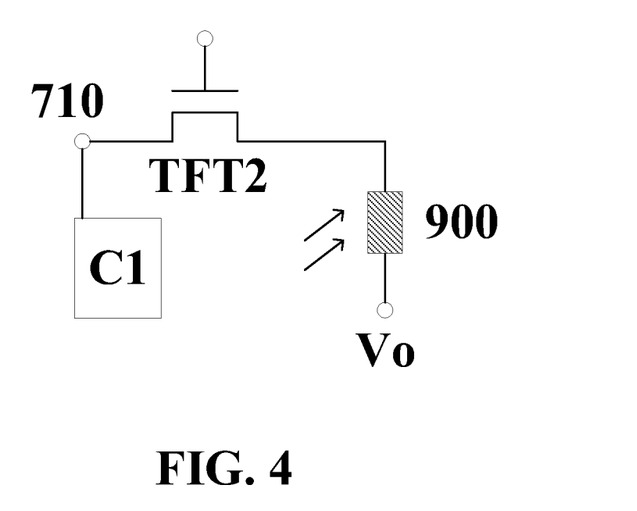
FIG. 4 is a circuit diagram of photo-sensing detector in some embodiments according to the present disclosure.

FIG. 4 is a circuit diagram of photo-sensing detector in some embodiments according to the present disclosure. Referring to FIGS. 1 to 4, the photosensor 900 is electrically connected to the second source electrode 313 of the second thin film transistor TFT2. The second drain electrode 312 of the second thin film transistor TFT2 is electrically connected to one of the read line 710, which in turn is connected to a photo-sensing circuit C1.

Various appropriate photosensors having a diode junction may be utilized in making and using the present digital microfluidic device. Examples of photosensors having a diode junction include, but are not limited to, a PN photodiode, a PIN photodiode, an avalanche photodiode, a MIM diode junction, a MIS diode junction, a MOS diode junction, a SIS diode junction, and a MS diode junction.

Figure 5:
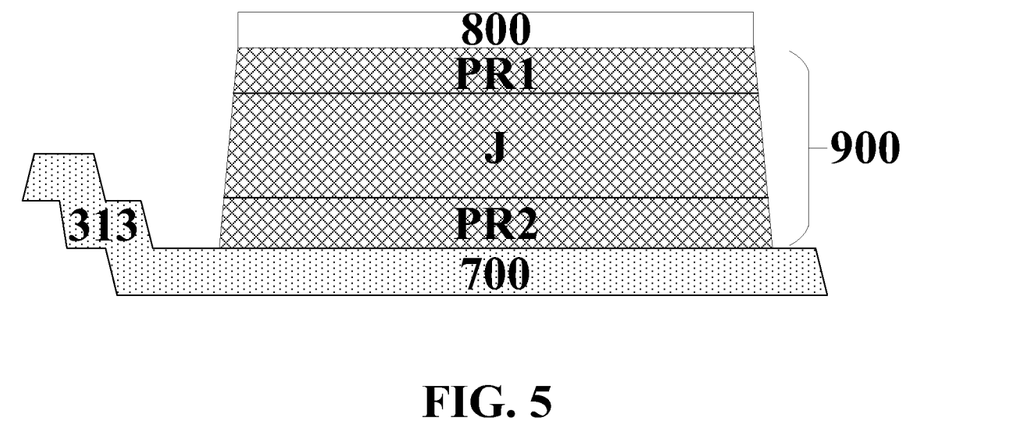
FIG. 5 is a schematic diagram illustrating the structure of a photosensor in some embodiments according to the present disclosure.

FIG. 5 is a schematic diagram illustrating the structure of a photosensor in some embodiments according to the present disclosure. Referring to FIG. 5, the photosensors 900 in some embodiments includes a first polarity region PR1 connected to a common electrode 800, a second polarity region PR2 connected to the second source electrode 313 of the second thin film transistor TFT2, and a diode junction J connecting the first polarity region PR1 and the second polarity region PR2. As used herein, the term diode junction refers to a junction that can exhibit current rectification, e.g., a junction that exhibits drastically different conductivities in one bias direction relative to the other.

Optionally, the photosensor having a diode junction includes a first polarity region having a first dopant, a second polarity region having a second dopant, and a diode junction connecting the first polarity region and the second polarity region. Optionally, the photosensor having a diode junction is reversely biased when the first polarity region is connected to a low voltage and the second polarity region is connected to a high voltage. For example, the photosensor having a diode junction is in a reversely biased state when the first polarity region is connected to a common electrode (low voltage, e.g., −5 V to 0 V). In some embodiments, the photosensor having a diode junction is a PN junction having a P+ doping semiconductor region as the first polarity region and an N+ doping semiconductor region as the second polarity region. In some embodiments, the photosensor having a diode junction is a PIN photodiode having a P+ doping semiconductor region as the first polarity region, an N+ doping semiconductor region as the second polarity region, and an intrinsic region of amorphous silicon between the P+ doping semiconductor region and the N+ doping semiconductor region.

Referring to FIG. 2 and FIG. 3, the digital microfluidic device in some embodiments further includes a common electrode signal line 810 electrically connected to the common electrode 800, and is configured to be provided with a common voltage signal to the common electrode 800.

Referring to FIGS. 2, 3, and 5, the digital microfluidic device in some embodiments further includes a contact electrode 700 electrically connecting the second polarity region PR2 to the second source electrode 313. Optionally, the contact electrode 700 and the second source electrode 313 are in a same layer and are made of a same conductive material. The contact electrode 700 and the second source electrode 313 may be patterned in a same patterning process, e.g., using a same mask plate.

Figure 6:
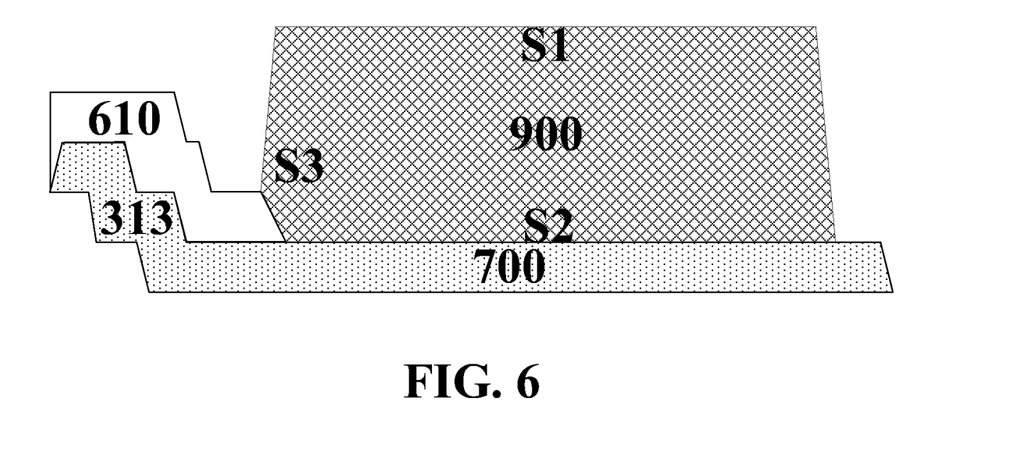
FIG. 6 is a schematic diagram illustrating the structure of a photosensor in some embodiments according to the present disclosure.

Referring to FIG. 2 and FIG. 3, the digital microfluidic device in some embodiments further includes a first insulating layer 610 on a side of the second source electrode 313 distal to the first base substrate 100. A lateral side of the photosensor 900 adjacent to the second source electrode 313 is spaced apart from the second source electrode 313 by the first insulating layer 610. FIG. 6 is a schematic diagram illustrating the structure of a photosensor in some embodiments according to the present disclosure. Referring to FIGS. 2, 3, and 6, the photosensor 900 in some embodiments includes a first side S1 facing away the first base substrate 100, a second side S2 opposite to the first side S1 and facing the first base substrate 100, and a third side S3 connecting the first side S1 and the second side S2. As shown in FIG. 6, in some embodiments, the lateral side spaced apart from the second source electrode 313 is the third side S3.

By having the first insulating layer 610 spacing apart the lateral side of the photosensor 900 from the second source electrode 313, contamination of the photosensor 900 by the metallic material of the second source electrode 313 (as well as the metallic material of the second drain electrode 312) during the process of patterning the photosensor 900 (e.g., during the etching process of the photosensor 900) can be avoided.

Moreover, the common electrode 800 also functions as an etch stop layer for protecting the photosensor 900 during patterning of a subsequent layer formed on the photosensor 900 (e.g., during patterning of a second insulating layer 611).

Referring to FIG. 2 and FIG. 3, in some embodiments, the first insulating layer 610 is on a side of the first source electrode 303, the first drain electrode 302, the second source electrode 313, and the second drain electrode 312 distal to the first base substrate 100. The thin film transistor driving substrate A includes a first via V1 extending through the first insulating layer 610. The photosensor 900 (e.g., the second polarity region PR2) is electrically connected to the second source electrode 313 through the first via V1 (e.g., through the contact electrode 700 electrically connecting the second polarity region PR2 to the second source electrode 313). Optionally, the first source electrode 303, the first drain electrode 302, the second source electrode 313, and the second drain electrode 312 are in a same layer, made of a same material, and patterning in a same process (e.g., using a same mask plate). As used herein, the term "same layer" refers to the relationship between the layers simultaneously formed in the same step. In one example, the first drain electrode 302, the second source electrode 313, and the second drain electrode 312 are in a same layer when they are formed as a result of one or more steps of a same patterning process performed in a same layer of material. In another example, the first drain electrode 302, the second source electrode 313, and the second drain electrode 312 can be formed in a same layer by simultaneously performing the step of forming the active layer and the step of forming the first electrode. The term "same layer" does not always mean that the thickness of the layer or the height of the layer in a cross-sectional view is the same.

Referring to FIG. 2 and FIG. 3, the digital microfluidic device in some embodiments further includes a second insulating layer 611 on a side of the common electrode 800 and the photosensor 900 distal to the first base substrate 100, and a common electrode signal line 810 on a side of the second insulating layer 611 distal to the first base substrate 100 and configured to be provided with a common voltage signal to the common electrode 800. Optionally, the thin film transistor driving substrate A includes a second via V2 extending through the second insulating layer 611, and the common electrode signal line 810 is electrically connected to the common electrode 800 through the second via V2.

Referring to FIG. 2 and FIG. 3, the digital microfluidic device in some embodiments further includes a third insulating layer 613 on a side of the common electrode signal line 810 distal to the first base substrate 100. The first electrode 200 is on a side of the third insulating layer 613 distal to the first base substrate 100, and on a side of the dielectric insulating layer 615 facing the first base substrate 100. Optionally, the thin film transistor driving substrate A includes a third via V3 extending through the third insulating layer 613 and the second insulating layer 611. The first electrode 200 is electrically connected to the first drain electrode 302 through the third via V3.

Referring to FIGS. 1 to 3, in some embodiments, an orthographic projection of the first electrode 200 on the first base substrate 100 covers an orthographic projection of the photosensor 900 on the first base substrate 100. Optionally, the first electrode 200 is a substantially transparent electrode. As used herein, the term "substantially transparent" means at least 50 percent (e.g., at least 60 percent, at least 70 percent, at least 80 percent, at least 90 percent, and at least 95 percent) of light in the visible wavelength range transmitted therethrough.

Figure 7:
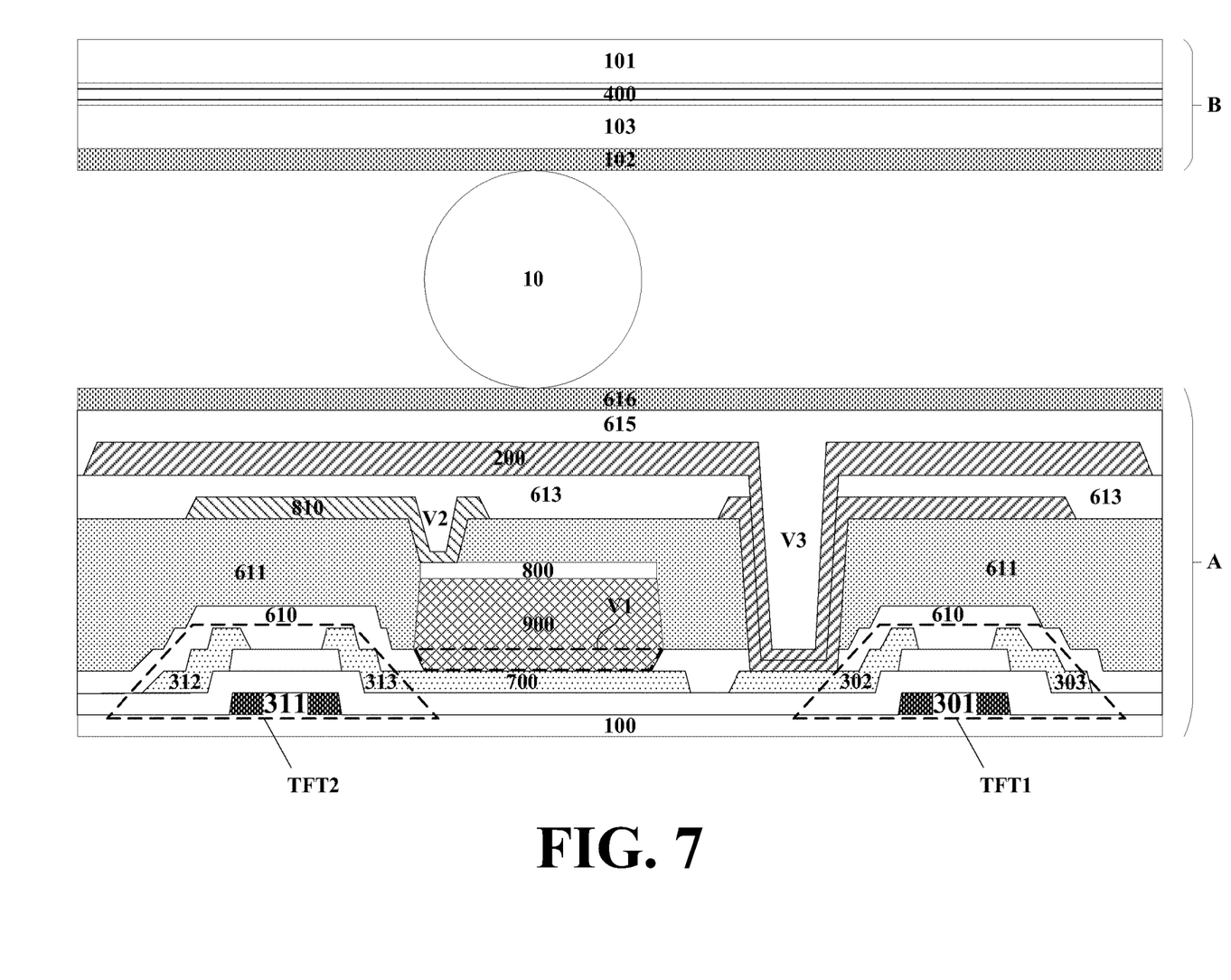
FIG. 7 is a schematic diagram illustrating a partial structure of a digital microfluidic device in some embodiments according to the present disclosure.

FIG. 7 is a schematic diagram illustrating a partial structure of a digital microfluidic device in some embodiments according to the present disclosure. Referring to FIG. 7, in some embodiments, an orthographic projection of the first electrode 200 on the first base substrate 100 at least covers a combination of an orthographic projection of the photosensor 900 on the first base substrate 100, an orthographic projection of the first thin film transistor TFT1 on the first base substrate 100, and an orthographic projection of the second thin film transistor TFT2 on the first base substrate 100. Optionally, and referring to FIG. 7, an orthographic projection of the first electrode 200 of each individual one of the plurality of sample actuating units 1 on the first base substrate 100 at least covers a combination of an orthographic projection of one of the plurality of sample position detecting units 2 on the first base substrate 100, and orthographic projections of other components of the one of the plurality of sample actuating units 1 on the first base substrate 100.

Figure 8:
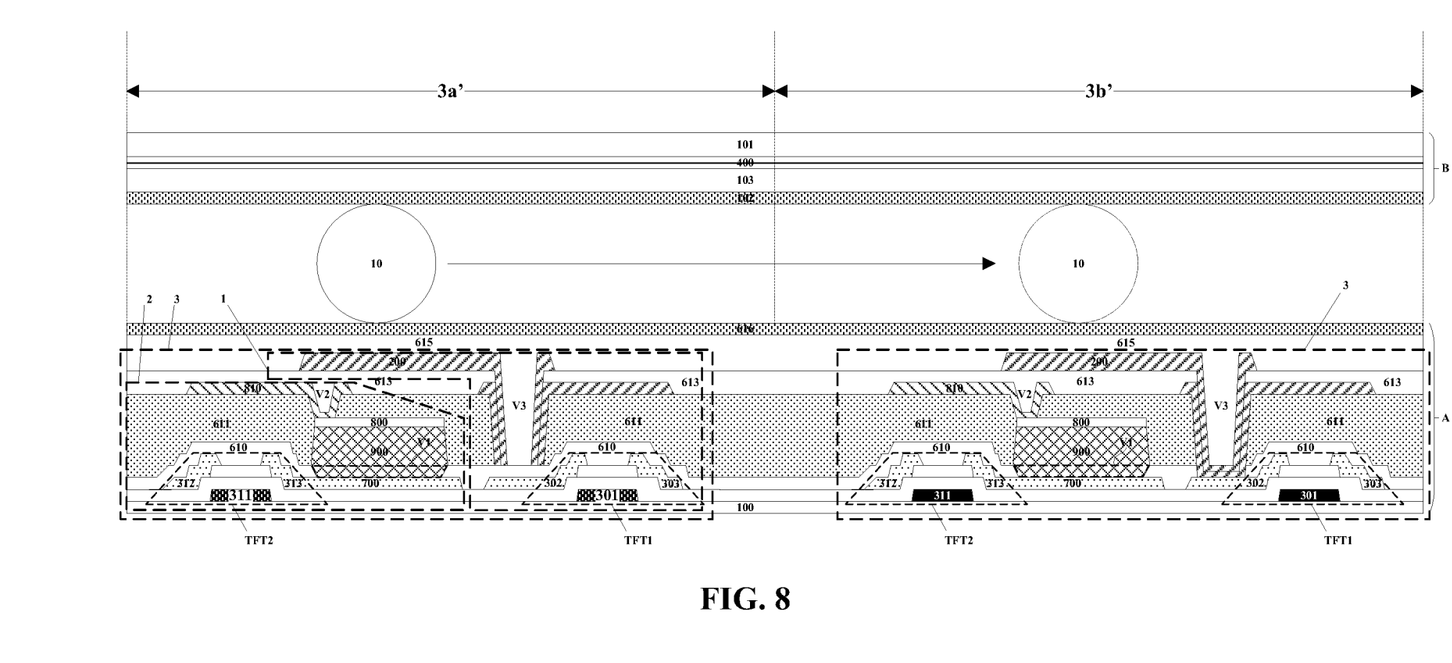
FIG. 8 is a schematic diagram illustrating a partial structure of a digital microfluidic device in some embodiments according to the present disclosure.
Figure 9:
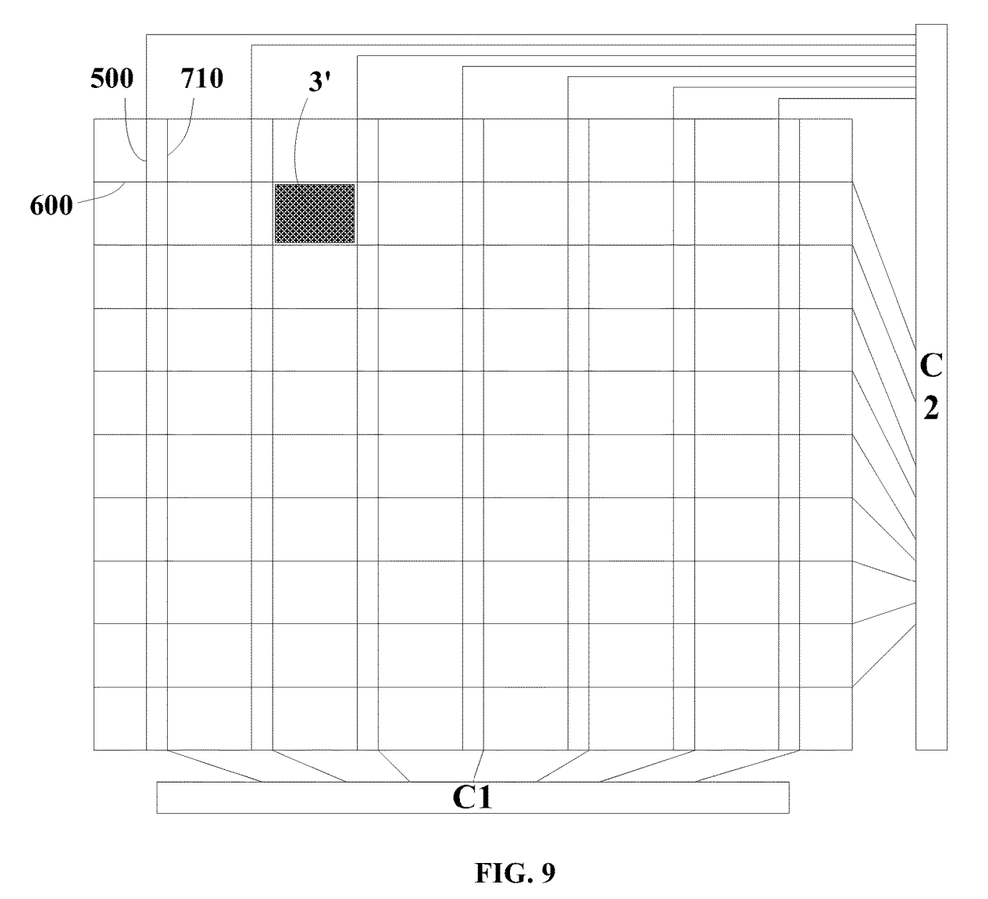
FIG. 9 is a schematic diagram illustrating a partial structure of a digital microfluidic device in some embodiments according to the present disclosure.

FIG. 8 is a schematic diagram illustrating a partial structure of a digital microfluidic device in some embodiments according to the present disclosure. FIG. 9 is a schematic diagram illustrating a partial structure of a digital microfluidic device in some embodiments according to the present disclosure. Referring to FIG. 8 and FIG. 9, the digital microfluidic device in some embodiments includes an array of a plurality of sample actuating and position detecting units 3. Optionally, each of the plurality of sample actuating and position detecting units 3 includes one of the plurality of sample actuating units 1 and one of the plurality of sample position detecting units 2. Optionally, the first transistor TFT1 of the one of the plurality of sample actuating units 1 and the second transistor TFT2 of the one of the plurality of sample position detecting units 2 are electrically connected to a same gate line 600, and are configured to be turned on simultaneously. Referring to FIG. 9, the digital microfluidic device in some embodiments includes a plurality of gate lines 600, a plurality of first electrode driving signal lines 500, and a plurality of read lines 710. Optionally, the plurality of gate lines 600 intersect with the plurality of first electrode driving signal lines 500 and the plurality of read lines 710, thereby forming a plurality of sample actuating and position detecting regions 3'. Optionally, the plurality of sample actuating and position detecting units 3 are respectively in the plurality of sample actuating and position detecting regions 3'.

In another aspect, the present disclosure provides a digital microfluidic method. The digital microfluidic method in some embodiments includes selectively transporting a liquid droplet using a digital microfluidic device as described herein. In some embodiments, the digital microfluidic method includes detecting a position of the liquid droplet relative to the plurality of sample position detecting units using the photosensor in each individual one of the plurality of sample position detecting units; and driving transportation of the liquid droplet on the digital microfluidic device based on the position of the liquid droplet relative to the plurality of sample position detecting units. Referring to FIG. 8, the liquid droplet 10 is at least partially located at a position in a present sample actuating and position detecting region 3a' of a plurality of sample actuating and position detecting regions. A present sample actuating unit of the plurality of sample actuating units 1 is located in the present sample actuating and position detecting region 3a'. In some embodiments, the step of driving transportation of the liquid droplet 10 includes determining a present sample actuating and position detecting region 3a' in which the liquid droplet 10 is at least partially located and a present sample actuating unit of the plurality of sample actuating units 1 is located; and actuating the first electrode 200 in a next directly adjacent sample actuating unit of the plurality of sample actuating units 1 in a next directly adjacent sample actuating and position detecting region 3b', thereby transporting the liquid droplet 10 along a direction from the present sample actuating unit to the next directly adjacent sample actuating unit (e.g., along a direction from the present sample actuating and position detecting region 3a' to the next directly adjacent sample actuating and position detecting region 3b').

In some embodiments, the step of detecting the position of the liquid droplet 10 relative to the plurality of sample position detecting units 2 includes providing a gate scanning signal to turn on the second thin film transistor TFT2; transmitting a photo-sensing signal detected by the photosensor 900; and comparing the photo-sensing signal with a reference signal, thereby determining presence or absence of the liquid droplet 10 at the position corresponding to the photosensor 900. Optionally, the step further includes providing a common voltage signal Vcom to the common electrode 800. When light irradiates on the photosensor 900, the photosensor 900 converts the photon into an electrical signal (e.g., a photo-current). When the second thin film transistor TFT2 are turned on, the photo-sensing signal generated by the photosensor 900 is transmitted to the second source electrode 313 through the contact electrode 700. The photo-sensing signal is then allowed to pass from the second source electrode 313 to the second drain electrode 312 when the second thin film transistor TFT2 is turned on. The photo-sensing signal is then transmitted through the read line 710 to a photo-sensing circuit (e.g., a photo-sensing circuit C1 as shown in FIG. 9). The photo-sensing signal detected by a photosensor 900 in the present sample actuating and position detecting region 3a' having the liquid droplet 10 is different from a photo-sensing signal detected by a photosensor 900 in a sample actuating and position detecting region absent of a liquid droplet 10, due to the presence of the liquid droplet 10 between the incident light and the photosensor 900. Thus, by comparing the photo-sensing signal with a reference signal, the present sample actuating and position detecting region 3a' having the liquid droplet 10 can be readily determined, and the position of the liquid droplet 10 relative to the plurality of sample position detecting units 2 can be readily detected.

In some embodiments, the digital microfluidic device includes an array of a plurality of sample actuating and position detecting units 3 arranged in rows and columns, as shown in FIG. 9. The method optionally includes providing a plurality of gate scanning signals respectively through the plurality of gate lines 600 to a plurality rows of the plurality of sample actuating and position detecting units 3 respectively, and turning on the second thin film transistors respectively in the plurality of sample actuating and position detecting units 3 row by row. Thus, absence or presence of the liquid droplet 10 in the plurality of sample actuating and position detecting units 3 can be determined by comparing the photo-sensing signals detected in the plurality of sample actuating and position detecting units 3 respectively with a reference signal.

In some embodiments, the method includes providing a gate scanning signal to the first gate electrode 301 of the first thin film transistor TFT1 and the second gate electrode 311 of the second thin film transistor TFT2, thereby turning on the first thin film transistor TFT1 and the second thin film transistor TFT2; providing a negative voltage $V_{2nd}$ to the first electrode 200 through the first electrode driving signal line 500; providing a negative voltage $V_{1st}$ to the common electrode 800 through the common electrode signal line 810; and providing the negative voltage $V_{2nd}$ to the second electrode 400. Optionally, voltage levels of $V_{1st}$ and $V_{2nd}$ are different from each other. Because the voltage levels on the first electrode 200 and the second electrode 400 are the same at this time, the liquid droplet 10 is not driven by the plurality of sample actuating unit 1.

In some embodiments, the photo-sensing circuit is configured to detect other information associated with the liquid droplet 10. Examples of relevant information of the liquid droplet 10 include one or more chemical characteristics of the liquid droplet 10, one or more physical characteristics of the liquid droplet 10, and one or more optical characteristics of the liquid droplet 10.

In some embodiments, the step of actuating the first electrode 200 in the next directly adjacent sample actuating unit includes providing a driving signal to the first source electrode 303 of the first thin film transistor TFT in the next directly adjacent sample actuating unit; and providing a gate scanning signal to turn on the first thin film transistor TFT1 in the next directly adjacent sample actuating unit, thereby allowing the driving signal to be provided to the first electrode 200 in the next directly adjacent sample actuating unit. Referring to FIG. 8, a present sample actuating and position detecting region 3a' and a next directly adjacent sample actuating and position detecting region 3b' of a plurality of sample actuating and position detecting regions are directly adjacent to each other. A present sample actuating unit is in the present sample actuating and position detecting region 3a'. A next directly adjacent sample actuating unit is in the next directly adjacent sample actuating and position detecting region 3b'. The position of the liquid droplet 10 is detected, and is determined to be at least partially in the present sample actuating and position detecting region 3a'. The outer surface of the first hydrophobic layer 616 is configured to be in contact with a liquid droplet 10 on it pathway. When an actuating voltage is applied to the first electrode 200 of the first thin film transistor TFT1 in the next directly adjacent sample actuating and position detecting region 3b', the de-wetting behavior between the liquid droplet 10 and a surface of the first hydrophobic layer 616 above the first electrode 200 in the next directly adjacent sample actuating and position detecting region 3b' undergoes a change, e.g., becoming less hydrophobic. As the actuating voltage increases, the contact angle of the liquid droplet 10 on the surface of the first hydrophobic layer 616 above the first electrode 200 in the next directly adjacent sample actuating and position detecting region 3b' decreases. As a result of the change in the de-wetting behavior and the decrease in the contact angle, the liquid droplet 10 is driven to move toward the first electrode 200 in the next directly adjacent sample actuating and position detecting region 3b'. The liquid droplet 10 is transported along the direction from the present sample actuating and position detecting region 3a' to the next directly adjacent sample actuating and position detecting region 3b'.

In some embodiments, the first electrode 200 in the present sample actuating and position detecting region 3a' is applied with a voltage signal different from the first electrode 200 in the next directly adjacent sample actuating and position detecting region 3b', to render the de-wetting behavior and the contact angle of the liquid droplet 10 to be different in the present sample actuating and position detecting region 3a' and the next directly adjacent sample actuating and position detecting region 3b', thereby transporting the liquid droplet 10 along the direction from the present sample actuating and position detecting region 3a' to the next directly adjacent sample actuating and position detecting region 3b'. Optionally, the voltage signal applied to the first electrode 200 in the present sample actuating and position detecting region 3a' has a polarity opposite from the voltage signal applied to the first electrode 200 in the next directly adjacent sample actuating and position detecting region 3b'. Optionally, the first electrode 200 in the present sample actuating and position detecting region 3a' is provided with a ground voltage, and the first electrode 200 in the next directly adjacent sample actuating and position detecting region 3b' is provided with an actuating voltage.

In one example, and referring to FIG. 8, the position of the liquid droplet 10 is detected, and is determined to be at least partially in the present sample actuating and position detecting region 3a'. A gate scanning signal is provided to the first gate electrode 301 of the first thin film transistor TFT1 and the second gate electrode 311 of the second thin film transistor TFT2, thereby turning on the first thin film transistor TFT1 and the second thin film transistor TFT2. A negative voltage $V_{2nd}$ is provided to the second electrode 400. The negative voltage $V_{2nd}$ is also provided to the first electrode 200 in the present sample actuating and position detecting region 3a'. A positive voltage $V_{3rd}$ is provided to the first electrode 200 in the next directly adjacent sample actuating and position detecting region 3b'. Due to the change of the de-wetting behavior and the contact angle of the liquid droplet 10 in the next directly adjacent sample actuating and position detecting region 3b', the liquid droplet 10 is transported along the direction from the present sample actuating and position detecting region 3a' to the next directly adjacent sample actuating and position detecting region 3b'.

In some embodiments, the digital microfluidic device includes an array of a plurality of sample actuating and position detecting units 3 arranged in rows and columns, as shown in FIG. 9. The method optionally includes providing a plurality of gate scanning signals respectively through the plurality of gate lines 600 to a plurality rows of the plurality of sample actuating and position detecting units 3 respectively, and turning on the first thin film transistors respectively in the plurality of sample actuating and position detecting units 3 row by row. A first driving signal is provided to the first electrode 200 in the next directly adjacent sample actuating and position detecting region 3b' through one of the plurality of plurality of first electrode driving signal lines 500, whereas a second driving signal is provided to the first electrode 200 in other sample actuating and position detecting regions (including the present sample actuating and position detecting region 3a').

In another aspect, the present disclosure provides a method of fabricating a digital microfluidic device. In some embodiments, the method includes forming a thin film transistor driving substrate. In some embodiments, the step of forming the thin film transistor driving substrate includes forming a plurality of sample actuating units and a plurality of sample position detecting units on a first base substrate; forming a dielectric insulating layer on a side of the plurality of sample actuating units and the plurality of sample position detecting units distal to the first base substrate; and forming a first hydrophobic layer on a side of the dielectric insulating layer distal to the first base substrate. Optionally, the step of forming each of the plurality of sample actuating units includes forming a first thin film transistor on the first base substrate, the first thin film transistor formed to include a first gate electrode, a first source electrode, and a first drain electrode; and forming a first electrode electrically connected to the first drain electrode and configured to drive transportation of a liquid droplet on the digital microfluidic device. Optionally, the step of forming each of the plurality of sample position detecting units includes forming a second thin film transistor on the first base substrate, the second thin film transistor formed to include a second gate electrode, a second source electrode, and a second drain electrode; and forming a photosensor electrically connected to the second source electrode, and configured to detect presence or absence of the liquid droplet on a position corresponding to the photosensor.

In some embodiments, the method further includes forming a gate line electrically connected to the first gate electrode and the second gate electrode, and configured to provide a gate scanning signal to turn on the first thin film transistor and the second thin film transistor; forming a first electrode driving signal line electrically connected to the first source electrode, and configured to provide a driving signal to the first electrode when the first thin film transistor is turned on; and forming a read line electrically connected to the second drain electrode, and configured to transmitting signals detected by the photosensor.

In some embodiments, the method further includes forming a common electrode electrically connected to the photosensor; and forming a common electrode signal line configured to be provided with a common voltage signal to the common electrode. Optionally, the step of forming the photosensor includes forming a first polarity region electrically connected to the common electrode; forming a second polarity region electrically connected to the second source electrode; and forming a diode junction electrically connecting the first polarity region and the second polarity region.

In some embodiments, the method further includes forming a contact electrode electrically connecting the second polarity region to the second source electrode. The contact electrode and the second source electrode are formed in a same layer and formed to include a same material, e.g., in a same patterning process using a same mask plate.

In some embodiments, the method further includes forming a first insulating layer on a side of the second source electrode distal to the first base substrate. The first insulating layer is formed to space apart a lateral side of the photosensor adjacent to the second source electrode from the second source electrode. Optionally, the first insulating layer is formed on a side of the first source electrode, the first drain electrode, the second source electrode, and the second drain electrode distal to the first base substrate. Optionally, the method further includes forming a first via extending through the first insulating layer. The photosensor is formed to be electrically connected to the second source electrode through the first via.

In some embodiments, the method further includes forming a common electrode electrically connected to the photosensor, and on a side of the photosensor distal to the first base substrate; forming a second insulating layer on a side of the common electrode and the photosensor distal to the first base substrate; and forming a common electrode signal line configured to be provided with a common voltage signal to the common electrode, and on a side of the second insulating layer distal to the first base substrate. Optionally, the method further includes forming a second via extending through the second insulating layer. The common electrode signal line is formed to be electrically connected to the common electrode through the second via.

In some embodiments, the method further includes forming a third insulating layer on a side of the common electrode signal line distal to the first base substrate. Optionally, the first electrode is formed on a side of the third insulating layer distal to the first base substrate, and on a side of the dielectric insulating layer facing the first base substrate. Optionally, the method further includes forming a third via extending through the third insulating layer and the second insulating layer. The first electrode is electrically connected to the first drain electrode through the third via.

In some embodiments, the method further includes forming a counter substrate spaced apart from the thin film transistor driving substrate. Optionally, the step of forming the counter substrate includes forming a second base substrate; forming a second electrode on a side of the second base substrate facing the thin film transistor driving substrate; and forming a second hydrophobic layer on a side of the second electrode facing the thin film transistor driving substrate.

Optionally, the first electrode and the photosensor are formed so that an orthographic projection of the first electrode on the first base substrate covers an orthographic projection of the photosensor on the base substrate. The first electrode is formed using a substantially transparent conductive material.

In some embodiments, the method includes forming an array of a plurality of sample actuating and position detecting units, each of which is formed to include one of the plurality of sample actuating units and one of the plurality of sample position detecting units. Optionally, the first transistor of the one of the plurality of sample actuating units and the second transistor of the one of the plurality of sample position detecting units are formed to be electrically connected to a same gate line, and are configured to be turned on simultaneously. Optionally, the method further includes forming a plurality of gate lines, a plurality of first electrode driving signal lines, and a plurality of read lines. Optionally, the plurality of gate lines are formed to intersect with the plurality of first electrode driving signal lines and the plurality of read lines, thereby forming a plurality of sample actuating and position detecting regions. The plurality of sample actuating and position detecting units are respectively formed in the plurality of sample actuating and position detecting regions.

Various appropriate conductive materials and various appropriate fabricating methods may be used to make the first gate electrode, the first source electrode, the first drain electrode, the second gate electrode, the second source electrode, the second drain electrode, the common electrode signal line and the first electrode driving signal line. For example, a conductive material may be deposited on the substrate by a plasma-enhanced chemical vapor deposition (PECVD) process. Examples of appropriate conductive materials include, but are not limited to, a metal material such as molybdenum, aluminum, copper, silver, chromium, neodymium, nickel, manganese, titanium, tantalum, and tungsten.

Various appropriate conductive materials and various appropriate fabricating methods may be used to make the first electrode, the second electrode, and the common electrode. For example, a transparent conductive material may be deposited on the substrate by a plasma-enhanced chemical vapor deposition (PECVD) process. Examples of appropriate transparent conductive materials include, but are not limited to, various transparent metallic electrode materials, transparent metal oxide electrode materials and transparent nano-carbon tubes. Examples of transparent metallic electrode materials include silver and magnesium/silver alloy or laminate. Examples of transparent metal oxide materials include, but are not limited to, indium tin oxide, indium zinc oxide, indium gallium oxide, and indium gallium zinc oxide.

Various appropriate insulating materials and various appropriate fabricating methods may be used to make the first insulating layer, the second insulating layer, the third insulating layer, the dielectric insulating layer and the second dielectric insulating layer. For example, an insulating material may be deposited on the substrate by a plasma-enhanced chemical vapor deposition (PECVD) process. Examples of appropriate insulating materials include, but are not limited to, polyimide, resin, silicon oxide ($SiO_y$), silicon nitride ($SiN_y$, e.g., $Si_3N_4$), and silicon oxynitride ($SiO_xN_y$).

Various appropriate insulating materials and various appropriate fabricating methods may be used to make the first hydrophobic layer and the second hydrophobic layer. For example, a hydrophobic material may be deposited on the substrate by coating. Examples of appropriate hydrophobic materials include, but are not limited to, teflon and CYTOP®.

In another aspect, the present disclosure provides a microfluidic apparatus including a digital microfluidic device described herein or fabricated by a method described herein. Optionally, the microfluidic apparatus further includes a photo-sensing circuit configured to receive signals detected by the photosensor; and an electrode driving circuit configured to provide a driving signal to the first electrode.

In another aspect, the present disclosure provides a lab-on-a-chip device including a digital microfluidic device described herein or fabricated by a method described herein.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A digital microfluidic device, comprising a thin film transistor driving substrate;
   wherein the thin film transistor driving substrate comprises:
   a first base substrate;
   a plurality of sample actuating units;
   a plurality of sample position detecting units;
   a dielectric insulating layer on a side of the plurality of sample actuating units and the plurality of sample position detecting units distal to the first base substrate; and
   a first hydrophobic layer on a side of the dielectric insulating layer distal to the first base substrate;
   wherein each of the plurality of sample actuating units comprises:
   a first thin film transistor on the first base substrate, and comprising a first gate electrode, a first source electrode, and a first drain electrode; and
   a first electrode electrically connected to the first drain electrode and configured to drive transportation of a liquid droplet on the digital microfluidic device;
   wherein each of the plurality of sample position detecting units comprises:
   a second thin film transistor on the first base substrate, and comprising a second gate electrode, a second source electrode, and a second drain electrode; and
   a photosensor electrically connected to the second source electrode, and configured to detect presence or absence of the liquid droplet on a position corresponding to the photosensor.

2. The digital microfluidic device of claim 1, further comprising:
   a gate line electrically connected to the first gate electrode and the second gate electrode, and configured to provide a gate scanning signal to turn on the first thin film transistor and the second thin film transistor,
   a first electrode driving signal line electrically connected to the first source electrode, and configured to provide a driving signal to the first electrode when the first thin film transistor is turned on; and
   a read line electrically connected to the second drain electrode, and configured to transmitting signals detected by the photosensor.

3. The digital microfluidic device of any one of claims 1 to 2, further comprising:
   a common electrode electrically connected to the photosensor; and
   a common electrode signal line configured to be provided with a common voltage signal to the common electrode;
   wherein the photosensor comprises:
   a first polarity region electrically connected to the common electrode;
   a second polarity region electrically connected to the second source electrode; and
   a diode junction electrically connecting the first polarity region and the second polarity region.

4. The digital microfluidic device of claim 3, further comprising a contact electrode electrically connecting the second polarity region to the second source electrode;
   wherein the contact electrode and the second source electrode are in a same layer and comprise a same material.

5. The digital microfluidic device of any one of claims 1 to 4, further comprising a first insulating layer on a side of the second source electrode distal to the first base substrate;
   wherein a lateral side of the photosensor adjacent to the second source electrode is spaced apart from the second source electrode by the first insulating layer.

6. The digital microfluidic device of claim 5, wherein the first insulating layer is on a side of the first source electrode, the first drain electrode, the second source electrode, and the second drain electrode distal to the first base substrate;
   the thin film transistor driving substrate comprises a first via extending through the first insulating layer; and
   the photosensor is electrically connected to the second source electrode through the first via.

7. The digital microfluidic device of claim 6, further comprising:
   a common electrode electrically connected to the photosensor, and on a side of the photosensor distal to the first base substrate;
   a second insulating layer on a side of the common electrode and the photosensor distal to the first base substrate;
   a common electrode signal line configured to be provided with a common voltage signal to the common electrode, and on a side of the second insulating layer distal to the first base substrate;
   wherein the thin film transistor driving substrate comprises a second via extending through the second insulating layer; and
   the common electrode signal line is electrically connected to the common electrode through the second via.

8. The digital microfluidic device of claim 7, further comprising:
   a third insulating layer on a side of the common electrode signal line distal to the first base substrate;
   wherein the first electrode is on a side of the third insulating layer distal to the first base substrate, and on a side of the dielectric insulating layer facing the first base substrate;
   the thin film transistor driving substrate comprises a third via extending through the third insulating layer and the second insulating layer; and the first electrode is electrically connected to the first drain electrode through the third via.

9. The digital microfluidic device of any one of claims 1 to 8, further comprising a counter substrate spaced apart from the thin film transistor driving substrate;
wherein the counter substrate comprises:
a second base substrate;
a second electrode on a side of the second base substrate facing the thin film transistor driving substrate; and
a second hydrophobic layer on a side of the second electrode facing the thin film transistor driving substrate.

10. The digital microfluidic device of any one of claims 1 to 9, wherein an orthographic projection of the first electrode on the first base substrate covers an orthographic projection of the photosensor on the first base substrate; and
the first electrode is a substantially transparent electrode.

11. The digital microfluidic device of any one of claims 1 to 10, comprising an array of a plurality of sample actuating and position detecting units;
wherein each of the plurality of sample actuating and position detecting units comprising one of the plurality of sample actuating units and one of the plurality of sample position detecting units; and
the first thin film transistor of the one of the plurality of sample actuating units and the thin film second transistor of the one of the plurality of sample position detecting units are electrically connected to a same gate line, and are configured to be turned on simultaneously.

12. The digital microfluidic device of claim 11, further comprising a plurality of gate lines, a plurality of first electrode driving signal lines, and a plurality of read lines;
wherein the plurality of gate lines intersect with the plurality of first electrode driving signal lines and the plurality of read lines, thereby forming a plurality of sample actuating and position detecting regions; and
the plurality of sample actuating and position detecting units are respectively in the plurality of sample actuating and position detecting regions.

13. A microfluidic apparatus, comprising the digital microfluidic device of any one of claims 1 to 12;
a photo-sensing circuit configured to receive signals detected by the photosensor, and
an electrode driving circuit configured to provide a driving signal to the first electrode.

14. A lab-on-a-chip device, comprising the digital microfluidic device of any one of claims 1 to 12.

15. A digital microfluidic method, comprising selectively transporting a liquid droplet using a digital microfluidic device;
wherein the digital microfluidic device comprises a thin film transistor driving substrate;
wherein the thin film transistor driving substrate comprises:
a first base substrate;
a plurality of sample actuating units;
a plurality of sample position detecting units;
a dielectric insulating layer on a side of the plurality of sample actuating units and the plurality of sample position detecting units distal to the first base substrate; and
a first hydrophobic layer on a side of the dielectric insulating layer distal to the first base substrate;
wherein each of the plurality of sample actuating units comprises:
a first base substrate;
a first thin film transistor on the first base substrate, and comprising a first gate electrode, a first source electrode, and a first drain electrode;
a first electrode electrically connected to the first drain electrode and configured to drive transportation of a liquid droplet on the digital microfluidic device;
wherein each of the plurality of sample position detecting units comprises:
a second thin film transistor on the first base substrate, and comprising a second gate electrode, a second source electrode, and a second drain electrode;
a photosensor electrically connected to the second source electrode, and configured to detect presence or absence of the liquid droplet on a position corresponding to the photosensor;
wherein the method comprises:
detecting a position of the liquid droplet relative to the plurality of sample position detecting units using the photosensor in each individual one of the plurality of sample position detecting units; and
driving transportation of the liquid droplet on the digital microfluidic device based on the position of the liquid droplet relative to the plurality of sample position detecting units.

16. The digital microfluidic method of claim 15, wherein driving transportation of the liquid droplet comprises:
determining a present sample actuating and position detecting region in which the liquid droplet is at least partially located and a present sample actuating unit of the plurality of sample actuating units is located; and
actuating the first electrode in a next directly adjacent sample actuating unit of the plurality of sample actuating units in a next directly adjacent sample actuating and position detecting region, thereby transporting the liquid droplet along a direction from the present sample actuating unit to the next directly adjacent sample actuating unit.

17. The digital microfluidic method of claim 16, wherein actuating the first electrode in the next directly adjacent sample actuating unit comprises:
providing a driving signal to the first source electrode of the first thin film transistor in the next directly adjacent sample actuating unit; and
providing a gate scanning signal to turn on the first thin film transistor in the next directly adjacent sample actuating unit, thereby allowing the driving signal to be provided to the first electrode in the next directly adjacent sample actuating unit.

18. The digital microfluidic method of any one of claims 15 to 17, wherein detecting the position of the liquid droplet relative to the plurality of sample position detecting units comprises:
providing a gate scanning signal to turn on the second thin film transistor;
transmitting a photo-sensing signal detected by the photosensor, and
comparing the photo-sensing signal with a reference signal, thereby determining presence or absence of the liquid droplet at the position corresponding to the photosensor.

19. The digital microfluidic method of any one of claims 15 to 18, wherein the digital microfluidic device comprises:
an array of a plurality of sample actuating and position detecting units arranged in rows and columns;
a plurality of gate lines;
a plurality of first electrode driving signal lines; and
a plurality of read lines;

wherein each of the plurality of sample actuating and position detecting units comprising one of the plurality of sample actuating units and one of the plurality of sample position detecting units;

the plurality of gate lines intersect with the plurality of first electrode driving signal lines and the plurality of read lines, thereby forming a plurality of sample actuating and position detecting regions; and the plurality of sample actuating and position detecting units are respectively in the plurality of sample actuating and position detecting regions;

wherein the method comprising providing a plurality of gate scanning signals respectively through the plurality of gate lines to a plurality rows of the plurality of sample actuating and position detecting units respectively; and first thin film transistors and second thin film transistors respectively in the plurality of sample actuating and position detecting units are turned on row by row.

20. A method of fabricating a digital microfluidic device, comprising forming a thin film transistor driving substrate;

wherein forming the thin film transistor driving substrate comprises forming a plurality of sample actuating units and a plurality of sample position detecting units on a first base substrate;

forming a dielectric insulating layer on a side of the plurality of sample actuating units and the plurality of sample position detecting units distal to the first base substrate; and forming a first hydrophobic layer on a side of the dielectric insulating layer distal to the first base substrate;

wherein forming each of the plurality of sample actuating units comprises:

forming a first thin film transistor on the first base substrate, the first thin film transistor formed to comprise a first gate electrode, a first source electrode, and a first drain electrode; and forming a first electrode electrically connected to the first drain electrode and configured to drive transportation of a liquid droplet on the digital microfluidic device;

wherein forming each of the plurality of sample position detecting units comprises:

forming a second thin film transistor on the first base substrate, the second thin film transistor formed to comprise a second gate electrode, a second source electrode, and a second drain electrode; and forming a photosensor electrically connected to the second source electrode, and configured to detect presence or absence of the liquid droplet on a position corresponding to the photosensor.

\* \* \* \* \*